(12) United States Patent  
Georgeson et al.

(10) Patent No.: US 8,726,737 B2  
(45) Date of Patent: May 20, 2014

(54) MULTI-FERROIC STRUCTURAL HEALTH MONITORING SYSTEMS

(71) Applicant: The Boeing Company, Seal Beach, CA (US)

(72) Inventors: Gary E. Georgeson, Tacoma, WA (US); Robert James Miller, Fall City, WA (US)

(73) Assignee: The Boeing Company, Chicago, IL (US)

( * ) Notice: Subject to any disclaimer, the term of this patent is extended or adjusted under 35 U.S.C. 154(b) by 0 days.

(21) Appl. No.: 13/764,866

(22) Filed: Feb. 12, 2013

(65) Prior Publication Data

US 2013/0147636 A1  Jun. 13, 2013

Related U.S. Application Data

(62) Division of application No. 12/883,354, filed on Sep. 16, 2010, now Pat. No. 8,397,580.

(51) Int. Cl.  
*G01B 7/16* (2006.01)

(52) U.S. Cl.  
USPC ............................................. 73/779; 73/760

(58) Field of Classification Search  
USPC .................... 73/760, 777, 786, 779  
See application file for complete search history.

(56) References Cited

U.S. PATENT DOCUMENTS

| | | | | |
|---|---|---|---|---|
| 7,434,480 B2 * | 10/2008 | Georgeson et al. | ...... | 73/862.041 |
| 7,647,206 B2 * | 1/2010 | Ford | .............. | 702/183 |
| 7,705,725 B2 * | 4/2010 | Matsen et al. | ................. | 340/529 |
| 7,806,657 B2 * | 10/2010 | Schram et al. | ................... | 416/61 |
| 7,898,243 B2 * | 3/2011 | Werner | ..................... | 324/207.22 |
| 8,250,928 B2 * | 8/2012 | Miller et al. | .................... | 73/779 |
| 2007/0114422 A1 | 5/2007 | Berkcan et al. | | |
| 2008/0143216 A1 | 6/2008 | Berkcan et al. | | |
| 2010/0005896 A1 | 1/2010 | Miller et al. | | |
| 2010/0154556 A1 | 6/2010 | Yin | | |

FOREIGN PATENT DOCUMENTS

| | | |
|---|---|---|
| EP | 2070688 A2 | 6/2009 |
| WO | 2010055282 A1 | 5/2010 |

OTHER PUBLICATIONS

Extended European Search Report for Application No. 11178342.9; Dec. 29, 2011; 6 pages.

* cited by examiner

*Primary Examiner* — Max Noori  
(74) *Attorney, Agent, or Firm* — Armstrong Teasdale LLP

(57) ABSTRACT

A structural health monitoring system for multiple layer structures includes a plurality of strain-sensitive magnetic particles dispersed within a bonding area between at least two individual layers, at least one multiferroic sensor dispersed on a surface of the multiple layer structure, proximate to an area of the structure to be monitored, the at least one multiferroic sensor capable of monitoring strains experienced by the strain-sensitive magnetic particles, and analyzing changes in the strains experienced by said strain-sensitive magnetic particles that may indicate damage or degradation in the structure, and a controller configured for periodic interrogation of the at least one multiferroic sensor.

20 Claims, 4 Drawing Sheets

MULTI-FERROIC STRUCTURAL HEALTH MONITORING SYSTEMS

CROSS REFERENCE TO RELATED APPLICATIONS

This application is a divisional of U.S. patent application Ser. No. 12/883,354, filed Sep. 16, 2010, which is incorporated herein by reference in its entirety.

BACKGROUND

The field of the disclosure relates generally to structural health monitoring of composite structures, and more specifically, to methods and systems for multi-ferroic structural health monitoring.

Composite materials are attractive for aerospace structural applications because of their high strength to weight ratios compared to metals. Particularly, composite materials are increasingly utilized in a wide variety of applications, including for aircraft structures. Composite aircraft structures include mixtures of bonded and bolted laminates with a variety of metallic and composite substructures. Other examples include composite sandwiched structures and other adhesive bonded panels including assemblies and structures with contoured surfaces.

Further improvements in composite structure affordability can be realized through low-cost and light weight structural health monitoring systems. Degradation of the composite laminate itself, due to impacts, lightning damage, thermal damage, or micro-cracking can be managed with condition-based-maintenance, reducing costs for non-destructive inspection (NDI), especially in limited access areas where disassembly is required.

Non-destructive evaluation (NDE) methods currently used to inspect bonded structures include modified pulse-echo ultrasonic testing (UT), infrared thermography, shearography, eddy current testing, and various high and low frequency ultrasonic methods.

Structural health monitoring (SHM) of composite and bonded structures has focused primarily on networks of piezo-electric sensors sending and receiving ultrasonic waves that interrogate the structure, or embedded fiber optic sensors measuring strain, moisture, temperature, and the like. Traditional nondestructive inspection methods rely upon quantifying defects within the structure to predict the flightworthiness of the structure. However, these inspection methods may be unable to ascertain the cohesiveness of the bond at any location absent defects. Further, piezo-electric and fiber optic-based SHM methods have limitations related to the embedding of the sensors, connectivity of the sensors, and costs for the supporting systems.

It remains desirable to inspect such structures to identify any defects, such as cracks, discontinuities, voids, or porosity, which could adversely affect the performance of the structure.

BRIEF DESCRIPTION

In one aspect, a structural health monitoring system for multiple layer structures is provided. The system includes a plurality of strain-sensitive magnetic particles dispersed within a bonding area between at least two individual layers, at least one multiferroic sensor dispersed on a surface of the multiple layer structure, proximate to an area of the structure to be monitored, the at least one multiferroic sensor capable of monitoring strains experienced by the strain-sensitive magnetic particles, and analyzing changes in the strains experienced by said strain-sensitive magnetic particles that may indicate damage or degradation in the structure, and a controller configured for periodic interrogation of the at least one multiferroic sensor.

In another aspect, a structural health monitoring system for multiple layer structures is provided. The structure includes a plurality of strain-sensitive magnetic particles dispersed within a bonding area between a surface of a first layer of a structure and a second layer of the structure, at least one multiferroic sensor dispersed on an opposing surface of the first layer, proximate to an area of the structure to be monitored, and a controller configured to periodically interrogate the at least one multiferroic sensor to monitor strains experienced by the plurality of strain-sensitive magnetic particles, and analyze changes in the strains experienced by the plurality of strain-sensitive magnetic particles to determine an amount of damage or degradation in the structure.

The features, functions, and advantages that have been discussed can be achieved independently in various embodiments or may be combined in yet other embodiments further details of which can be seen with reference to the following description and drawings.

DETAILED DESCRIPTION

The described embodiments generally include three elements: magnetostrictive particles incorporated into a composite structure, multi-ferroic sensor array appliqués applied to the composite structure, and a controller with wireless communication, for interrogating the sensors within the array.

Figure 1:
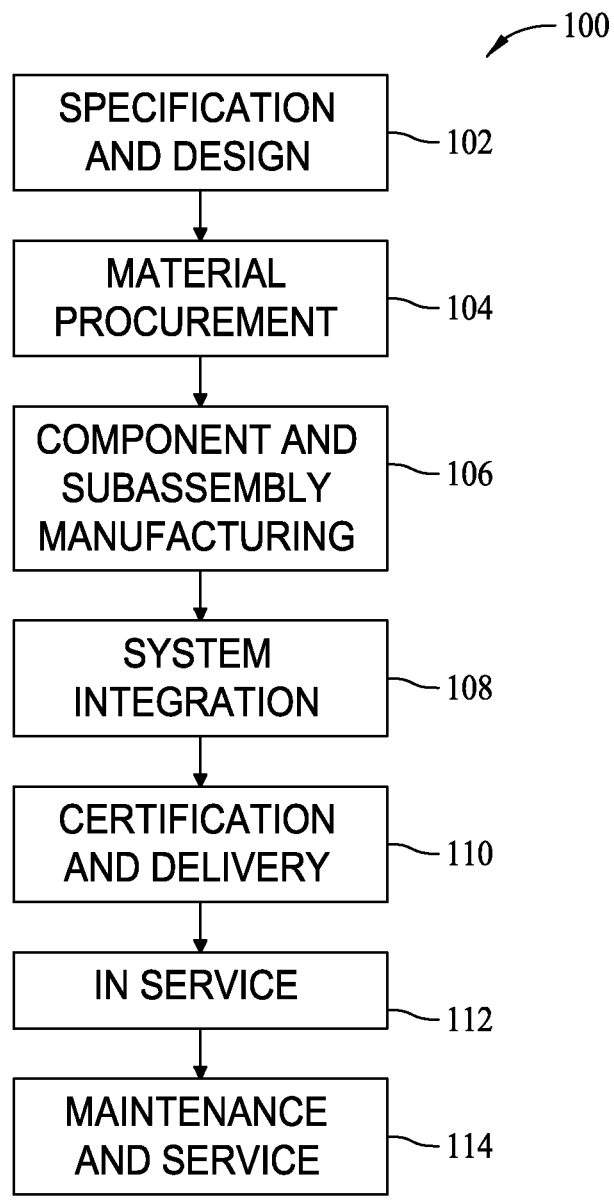
FIG. 1 is a flow diagram of an aircraft production and service methodology.
Figure 2:
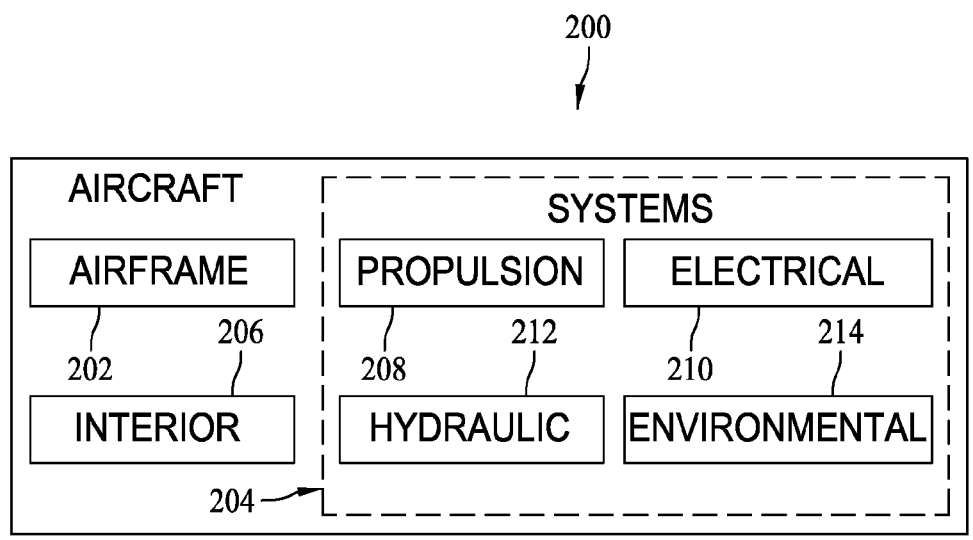
FIG. 2 is a block diagram of an aircraft.

Referring more particularly to the drawings, embodiments of the disclosure may be described in the context of aircraft manufacturing and service method 100 as shown in FIG. 1 and an aircraft 200 as shown in FIG. 2. During pre-production, aircraft manufacturing and service method 100 may include specification and design 102 of aircraft 200 and material procurement 104.

During production, component and subassembly manufacturing 106 and system integration 108 of aircraft 200 takes place. Thereafter, aircraft 200 may go through certification and delivery 110 in order to be placed in service 112. While in service by a customer, aircraft 200 is scheduled for routine maintenance and service 114 (which may also include modification, reconfiguration, refurbishment, and so on).

Each of the processes of aircraft manufacturing and service method 100 may be performed or carried out by a system integrator, a third party, and/or an operator (e.g., a customer). For the purposes of this description, a system integrator may include, without limitation, any number of aircraft manufacturers and major-system subcontractors; a third party may include, for example, without limitation, any number of venders, subcontractors, and suppliers; and an operator may be an airline, leasing company, military entity, service organization, and so on.

As shown in FIG. 2, aircraft 200 produced by aircraft manufacturing and service method 100 may include airframe 202 with a plurality of systems 204 and interior 206. Examples of systems 204 include one or more of propulsion system 208, electrical system 210, hydraulic system 212, and environmental system 214. Any number of other systems may be included in this example. Although an aerospace example is shown, the principles of the disclosure may be applied to other industries, such as the automotive industry.

Apparatus and methods embodied herein may be employed during any one or more of the stages of aircraft manufacturing and service method 100. For example, without limitation, components or subassemblies corresponding to component and subassembly manufacturing 106 may be fabricated or manufactured in a manner similar to components or subassemblies produced while aircraft 200 is in service.

Also, one or more apparatus embodiments, method embodiments, or a combination thereof may be utilized during component and subassembly manufacturing 106 and system integration 108, for example, without limitation, by substantially expediting assembly of or reducing the cost of aircraft 200. Similarly, one or more of apparatus embodiments, method embodiments, or a combination thereof may be utilized while aircraft 200 is in service, for example, without limitation, to maintenance and service 114 may be used during system integration 108 and/or maintenance and service 114 to determine whether parts may be connected and/or mated to each other.

The description of the different advantageous embodiments has been presented for purposes of illustration and description, and is not intended to be exhaustive or limited to the embodiments in the form disclosed. Many modifications and variations will be apparent to those of ordinary skill in the art. Further, different advantageous embodiments may provide different advantages as compared to other advantageous embodiments. The embodiment or embodiments selected are chosen and described in order to best explain the principles of the embodiments, the practical application, and to enable others of ordinary skill in the art to understand the disclosure for various embodiments with various modifications as are suited to the particular use contemplated.

Figure 3:
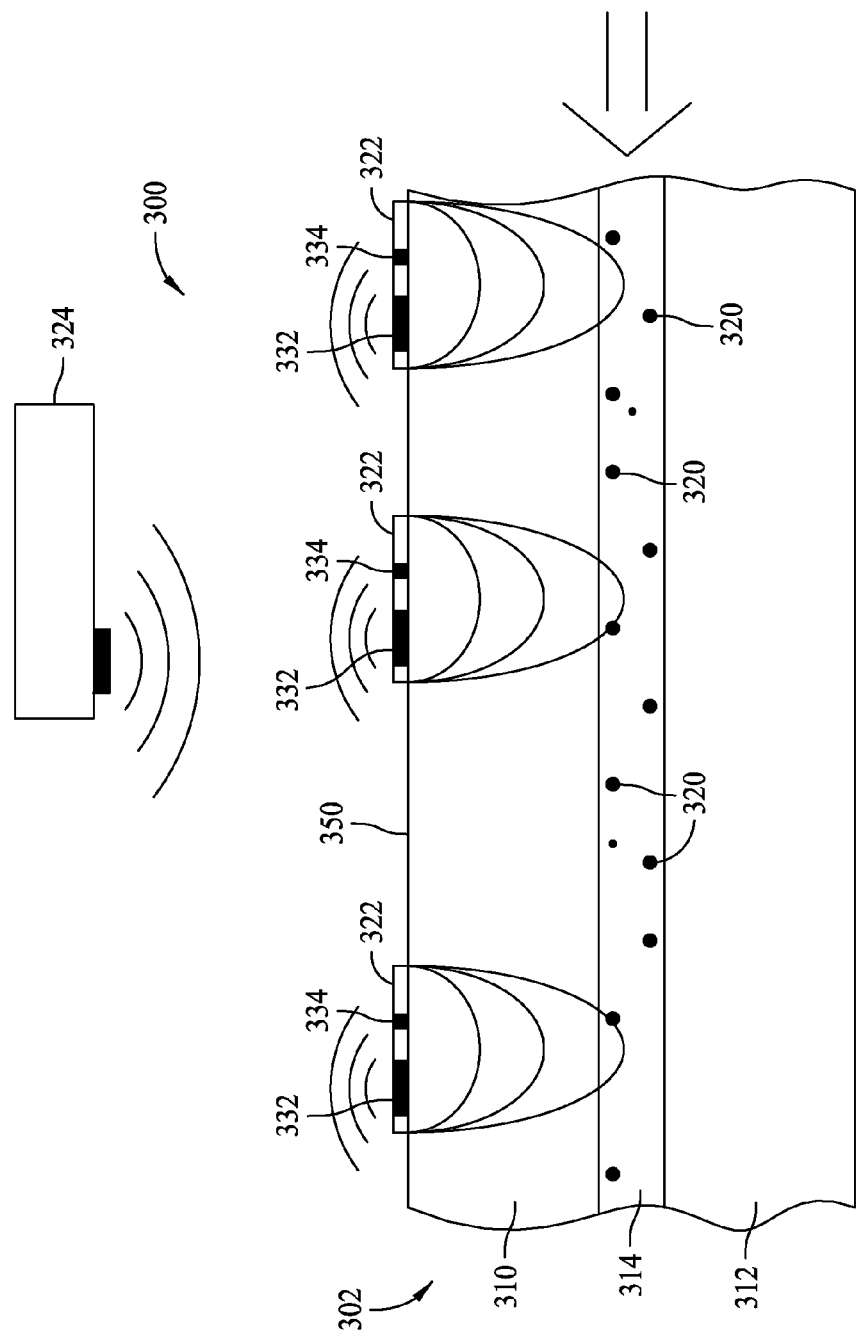
FIG. 3 is a schematic illustration of a multi-ferroic structural health monitoring system for a structure.

Turning now to FIG. 3, a schematic illustration of a multiferroic structural health monitoring system 300 for a structure 302 is provided. Structure 302 includes a first composite layer 310, a second composite layer 312, and an adhesive layer 314 therebetween that is typically referred to as a bondline 314. It should be noted that first composite layer 310 and second composite layer 312 may be fully cured composite skin, laminate or sandwich layers with the bondline 314 being an adhesive for holding the layers together or plies of composite material stacked together to form a laminate with bondline 314 being a layer of resin in and around the fibers or fiber tows utilized in a composite fabrication process.

System 300 includes strain-sensitive magnetic particles 320 dispersed within the bondline 314, distributed as evenly as possible, multiferroic sensors 322 for monitoring strains experienced by strain-sensitive magnetic particles 320 and a central controller 324 for periodically interrogating the multiferroic sensors 322 and analyzing changes in the responses to interrogation that may indicate damage or degradation in the structure 302.

The magnetic signature of magnetostrictive particles 320 placed within bondline 314 or elsewhere in the structure 302 is sensitive to the strain induced by growing cracks, corrosion or delaminations, and even weakened bonds. It has been demonstrated that loading of the structure 302 increases the strain at these defects/degradation locations, thereby increasing the magnetic signature and defect sensitivity of the particles 320 near these damage locations. Similarly, the static and dynamic loading experienced by structures similar to structure 302 during flight operations can produce or increase the magnetic response and defect sensitivity of the magnetostrictive particles 320 within a bondline such as bondline 314. The described embodiments utilize this approach, and with the application of multiferroic sensors 322 to a structure define the structural health monitoring system 300 for bonded and composite structure 302.

Figure 4:
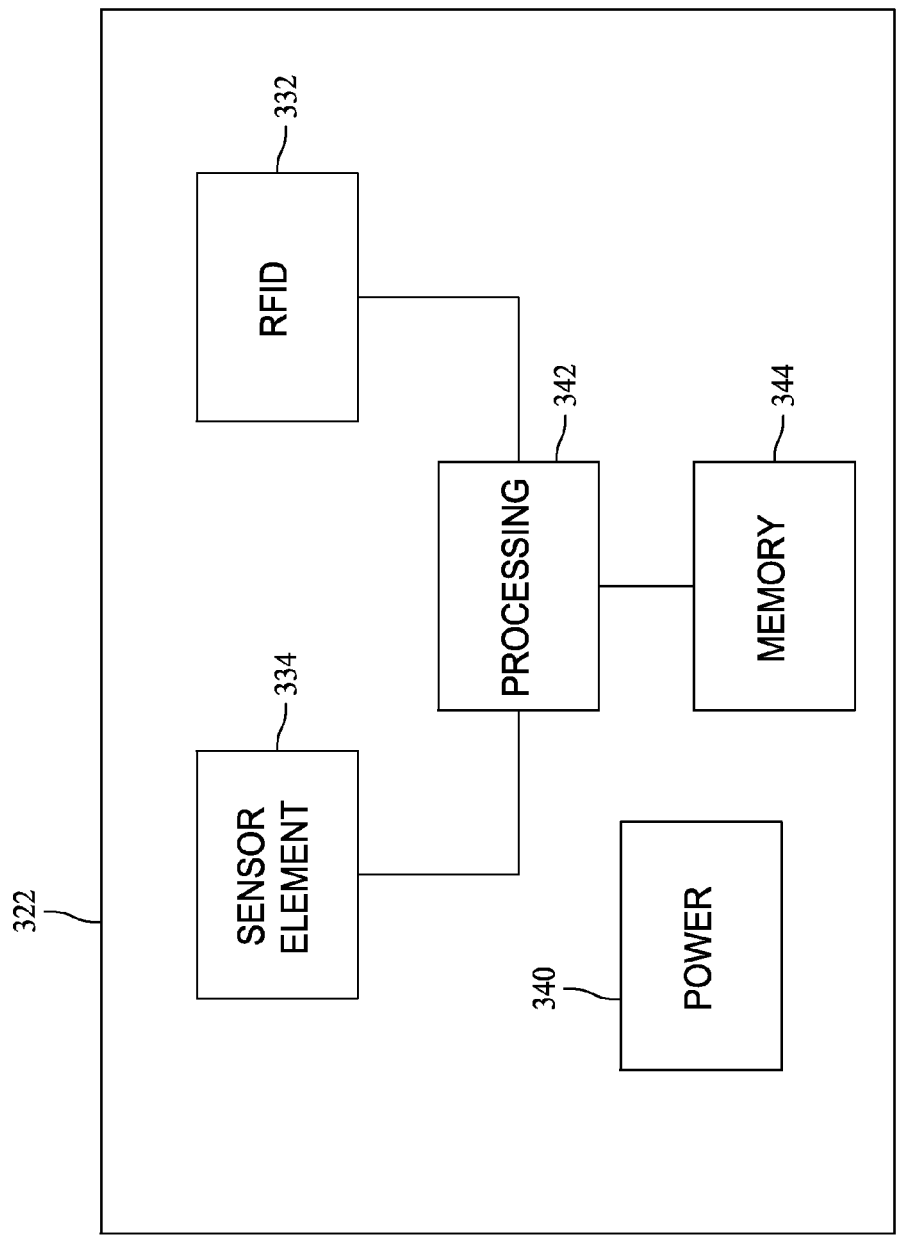
FIG. 4 is a block diagram of a multiferroic sensor.

In one embodiment, the multiferroic sensors 322 are located at a surface 330 of the structure 302 close to a critical area to be monitored. As an example only, a multiferroic sensor may be dispersed on an outer surface of the first composite layer 310 or the second composite layer 312. In embodiments, and as shown in FIG. 4, these sensors 322 incorporate RFID devices 332 as well as sensor elements 334. A power supply 340 such as energy harvesting elements and/or batteries, a data processing capability 342, a memory 344 are combined with RFID devices 332 and sensor elements 334 to provide a wireless installation with the capability to store information indicative of the environment sensed by the sensor element 334 and communicate such information to central controller 324 through RFID interrogation.

Multiferroic sensor elements 334 are very sensitive magnetic sensor elements. As such, an array of sensors 322, each sensor 322 having a multiferroic sensor element 334, can provide very high sensitivity and resolution to pinpoint even very small defects that might occur within bondline 314. In the embodiments described herein, the multiferroic sensor elements 334 are configured to either sense the magnetization level of the magnetostrictive particles 320 or to sense the magnetic permeability of the particles 320.

As mentioned above, strain-sensitive magnetic particles 320 are distributed throughout the bondline 314 as evenly as possible. In one embodiment, strain-sensitive magnetic particles 320 are about 0.01 inch apart such that very small defects (as small as 0.01 inch) proximate bondline 314 can be sensed. Other configurations where the particles 320 are farther apart are contemplated, depending on the application. In all such embodiments, sensors 322 are capable of sensing changes in the signatures of strain-sensitive magnetic particles 320 over an area that has a radius of about four inches, and are distributed accordingly, and to ensure overlapping coverage. Additionally an orientation of the magnetic particles 322 within the structure can be controlled by applying an electric field during fabrication of the structure.

In addition, multiferroic sensor elements 334 are simpler to design and manufacture and are more sensitive than alternative magnetic sensors such as coils, magneto-optical effect sensors and pick-up coils.

In the currently illustrated embodiments, and referring back to FIG. 3, multiferroic sensors 322 are located on an adjacent surface 350 of the structure 302 containing the bondline 314. As such, multiferroic sensors 322 are operable to monitor, measure, and in embodiments, store the magnetic signature caused by the local strains proximate magnetostrictive particles 320, with very high resolution and sensitivity.

As easily understood, an array of these multiferroic sensors 322 are integrated into a magnetic signature monitoring system, so more than one bond location can be monitored. In embodiments, computerized controller 324 periodically interrogates each sensor 322, for example using RFID technology, looking for symptoms of potential structural health problems. In one embodiment, sensors 322 are fabricated using MEMS technology to reduce sensor size and integrate other capabilities such as energy harvesting from ambient vibrations and energy storage.

Along with various types of damage or degradation, some types of weak bonds are detectable and can be monitored using the described embodiments because the induced strain in the adhesive of bondline 314 is sensitive to the modulus of adjacent materials such as low modulus contaminants. Such a monitoring method is useful as an indicator of local failure when plastic strains in previously weak bonds are sensed.

Current structural health monitoring (SHM) approaches utilize piezo-electric arrays or fiber optic sensor arrays for damage detection. However, embedded or attached piezoelectric sensor element arrays can indicate impact damage in composite structure, but are not typically sensitive to bondline degradation. Such sensor arrays also require high voltages in order to generate ultrasonic waves that interrogate structure. Their presence, if embedded, may adversely affect the structural performance. Fiber optics are gaining interest as SHM sensors, but, the attachment equipment interface using fiber optics is complicated and costly. Other magnetic sensors types that could be used for SHM are not as sensitive as multiferroic sensors. Existing magnetometers which are able to achieve high levels of sensitivity are known as superconducting quantum interference devices (SQUIDs). SQUIDs must operate at cryogenic temperatures, which requires a large and costly setup. As a result, many applications that would benefit from high-sensitivity magnetometry, have not been possible outside of a well-equipped lab.

System 300, as described above, allows real time detection and monitoring of weak bonds or smaller unbonds, with small, lightweight, distributed sensors sensing changes in the magnetic signatures associated magnetostrictive particles 320 with low power consumption requirements while taking advantage of present wireless interface capabilities.

The magnetostrictive particles 320 are located in the bondline 314 between layers of composite material or between cured composite structures or within the composite structure. Redundant arrays of small multiferroic sensors 322 are attached to the adjacent surfaces and have a wireless (such as RFID) communications capability. Wireless devices such as communications controller 324 are utilized for communication with individual sensors 322 as well as one or more data collection and storage computers (not shown).

The magnetostrictive particles 320 are fabricated from a magnetostrictive metal, alloy or ferrite material. Materials that are highly magnetostrictive in nature, such as Terfenol-D or nickel, have a higher sensitivity to strain. The particles 320 may be of any shape but high aspect ratio shapes such as flakes or fibers have better mechanical coupling to the adjacent structural materials and are therefore more sensitive to strain in the structure. Other high aspect ratio forms such as thin coatings of magnetostrictive material on nonmagnetic fibers (such as fiberglass or carbon) are also effective. The magnetostrictive particles 320 may be a wide range of sizes smaller than the thickness of the bondline and are preferably much smaller in order to minimize any detrimental effects of the particle on the bond strength.

The redundant arrays of multiferroic sensors 322 may include the sensor elements, drivers, energy harvesting devices and a digital memory device as described above. The sensors 322 may include both magnetic and acoustic sensor elements. The magnetic sensors 322, in embodiments, are disbursed in an array that is as large as necessary or practical to cover the bondline area to be monitored. The magnetic sensors 322 include elements that are based on multiferroic technology. In a typical application, the array of sensors 322 may include hundreds or thousands of individual sensors that are typically less than 100 microns across. Each sensor 322 may be made of one or more layer pairs of magnetostrictive and piezoelectric materials to form a multiferroic device. An array may include additional sensors such as piezoelectric sensors to detect mechanical vibrations. The array may also include magnetic drivers (not sensors) that produce a time varying magnetic field or mechanical vibrations in the bondline 314. The sensor electronics correlate the imposed magnetic and or mechanical signal with the sensed signals to interpret the strain in the bondline 314 for defects or degradation. In one embodiment, the drivers and sensors are powered by batteries which may be charged by energy harvesting piezoelectric devices that harvest ambient mechanical vibrations.

The sensor arrays, electronics and wireless communications devices may all be incorporated within thin film devices mounted on a flexible appliqué that is attached to the surface using pressure sensitive adhesives or other convenient approaches. The data collection and storage computer associated with controller 324 periodically, or on demand, interrogates some or all of the sensor arrays using wireless communications and alone, or in conjunction with an associated computer, tracks history and sensed changes with the structure.

In other embodiments, the strain-sensitive magnetic particles 320 are dispersed throughout the structure, for example, aircraft skin panels, stringers, and the like. As described above, at least one multiferroic sensor 322 is dispersed on a surface of the structure, proximate to an area of the structure to be monitored. The multiferroic sensor(s) 322 are capable of monitoring strains experienced by the strain-sensitive magnetic particles 320, The controller 324 is configured for periodic interrogation of the multiferroic sensor(s) 322

A testing process, for example, may include: generation of magnetic and or mechanical vibrations by one or more drivers, reaction of the magnetostrictive particles 320 to the vibrations that is dependent on the local strain, sensing of the reaction by the sensors 322, receiving data from sensors 322 at controllers 324, transmission of the sensor data from controller 324 to a post processing device, and processing of the data from each sensor 322 in the array to form a high resolution image of the bondline 324. Storage and wireless transmission of the image data to the computer along with correlation of the image with historical data is then utilized to monitor structural health of the composite structure.

The generated magnetic vibration may be at any frequency ranging from near DC to Gigahertz. Frequencies in the range of a few hundred Hertz are preferable because attenuation is low. The magnetostrictive particles 320 react to the magnetic vibration (by virtue of their magnetic permeability) by partially magnetizing and demagnetizing at the same frequency. The permeability of the magnetostrictive particles affects the magnetic field at the sensor elements generating a detectable voltage in the sensor that is proportional to the magnetic permeability of the magnetostrictive particles. The detected signal also depends on the local strain because of the magnetostrictive properties of the particles 320.

The local strain depends on the presence or absence of structural defects including weak and unbonded joints. In this way the structural health is monitored. The effect of defects on the local strain is accentuated by application of a mechanical vibration either from ambient vibrations or from mechanical vibrations generated by mechanical drivers. Use of ambient vibrations has the virtue of simplicity but use of generated vibrations may lead to improved signal to noise ratios (and thus to improved sensitivity to defects) because signal processing techniques can correlate the mechanical and magnetic signals to minimize magnetic noise that may arise from nearby electronics or magnetic materials. The generated mechanical vibration may be at low levels so as not to cause damage or interfere with other subsystems. The mechanical drivers may be located with the sensor array or may be from a distant source.

In other embodiments, the strain sensitive, magnetic particles 320 may be dispersed throughout the multiple layer structure. The strains experienced by such particles may be compared with a baseline for determination of any manufacturing defects in the multiple layer structure.

The signal from each sensor element may be used to form a strain image of the bondline 314, or structure, using conventional image processing techniques. The resolution may be on the order of the size of the sensor elements which may be less than 100 microns and as small as 10 microns. The sensor array may image the bondline 314 periodically or as instructed by the data collection and storage computer(s). The image is transmitted to the computer, compared to historical data and reports issued to maintenance personnel.

This written description uses examples to disclose various embodiments, which include the best mode, to enable any person skilled in the art to practice those embodiments, including making and using any devices or systems and performing any incorporated methods. The patentable scope is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. A structural health monitoring system for multiple layer structures comprising:
    a plurality of strain-sensitive magnetic particles dispersed within a bonding area between at least a first surface of a first layer and a second layer of a multiple layer structure;
    at least one multiferroic sensor dispersed on a second surface of the first layer of the multiple layer structure, proximate to an area of the structure to be monitored, said at least one multiferroic sensor capable of monitoring strains experienced by said strain-sensitive magnetic particles, and analyzing changes in the strains experienced by said strain-sensitive magnetic particles that may indicate damage or degradation in the structure; and
    a controller configured for periodic interrogation of the at least one multiferroic sensor.

2. The structural health monitoring system of claim 1 wherein said plurality of strain-sensitive magnetic particles are substantially evenly dispersed within the bonding area.

3. The structural health monitoring system of claim 1 wherein said multiferroic sensors are dispersed on the surface of the multiple layer structure to provide overlapping coverage of said plurality of strain-sensitive magnetic particles.

4. The structural health monitoring system of claim 1 wherein said at least one multiferroic sensor is configured to sense at least one of a magnetization level of said magnetic particles and a magnetic permeability of said magnetic particles.

5. The structural health system of claim 1 wherein said at least one multiferroic sensor comprises an RFID communications capability for responding to said controller.

6. The structural health monitoring system of claim 1 wherein each said multiferroic sensor comprises:
    a data processing capability;
    a memory;
    an RFID communications capability; and
    a multiferroic sensor element, each said multiferroic sensor capable of storing information indicative of the environment sensed by said sensor element, and communicating such information to said controller through RFID interrogation.

7. The structural health monitoring system of claim 6 wherein each said multiferroic sensor comprises at least one of a battery and an energy harvesting device.

8. The structural health monitoring system of claim 1 wherein said plurality of strain-sensitive magnetic particles comprise at least one of a magnetostrictive metal, a magnetostrictive alloy, and a magnetostrictive ferrite material.

9. The structural health monitoring system of claim 1 wherein said plurality of strain-sensitive magnetic particles comprise a high aspect ratio shape for coupling to the structure and increased sensitivity to strain in the structure.

10. The structural health monitoring system of claim 1 wherein said plurality of strain-sensitive magnetic particles comprise nonmagnetic fibers having a coating of magnetostrictive material thereon.

11. The structural health monitoring system of claim 1 further comprising a flexible appliqué for application to the surface of the structure, said flexible appliqué comprising said at least one multiferroic sensor fabricated as a thin film device attached thereto.

12. A structural health monitoring system for multiple layer structures comprising:
    a plurality of strain-sensitive magnetic particles dispersed within a bonding area between a surface of a first layer of a structure and a second layer of the structure;
    at least one multiferroic sensor dispersed on an opposing surface of the first layer, proximate to an area of the structure to be monitored; and
    a controller configured to periodically interrogate the at least one multiferroic sensor to monitor strains experienced by said plurality of strain-sensitive magnetic particles, and analyze changes in the strains experienced by said plurality of strain-sensitive magnetic particles to determine an amount of damage or degradation in the structure.

13. The structural health monitoring system of claim 12 wherein said plurality of strain-sensitive magnetic particles are substantially evenly dispersed within the bonding area, and said at least one multiferroic sensor is dispersed on the opposing surface of the first layer to provide overlapping coverage of said plurality of strain-sensitive magnetic particles.

14. The structural health monitoring system of claim 13 wherein said at least one multiferroic sensor is configured to sense at least one of a magnetization level of said plurality of strain-sensitive magnetic particles and a magnetic permeability of said plurality of strain-sensitive magnetic particles.

15. The structural health monitoring system of claim 12 wherein said at least one multiferroic sensor comprises:
    a data processing capability;
    a memory;
    an RFID communications capability; and
    a multiferroic sensor element configured detect an environment, store information indicative of the environment in said memory, and communicate the information to said controller through said RFID communications capability.

16. The structural health monitoring system of Claim 15 wherein said multiferroic sensor element comprises at least one of a battery and an energy harvesting device.

17. The structural health monitoring system of claim 12 wherein said plurality of strain-sensitive magnetic particles comprise at least one of a magnetostrictive metal, a magnetostrictive alloy, and a magnetostrictive ferrite material.

18. The structural health monitoring system of claim 12 wherein said plurality of strain-sensitive magnetic particles comprise a high aspect ratio shape for coupling to the structure and increased sensitivity to strain in the structure.

19. The structural health monitoring system of claim 12 wherein said plurality of strain-sensitive magnetic particles comprise nonmagnetic fibers having a coating of magnetostrictive material thereon.

20. The structural health monitoring system of claim 12 further comprising a flexible appliqué for application to the structure, said flexible appliqué comprising said at least one multiferroic sensor fabricated as a thin film device attached thereto.

* * * * *